US012694925B2

(12) United States Patent
Sakurai et al.

(10) Patent No.: US 12,694,925 B2
(45) Date of Patent: Jul. 28, 2026

(54) STORAGE DEVICE

(71) Applicant: Kioxia Corporation, Tokyo (JP)

(72) Inventors: Katsuaki Sakurai, Yokohama Kanagawa (JP); Daisuke Arizono, Yokohama Kanagawa (JP); Mitsuhiro Abe, Kawasaki Kanagawa (JP); Yasuhiro Hirashima, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 98 days.

(21) Appl. No.: 18/593,233

(22) Filed: Mar. 1, 2024

(65) Prior Publication Data

US 2024/0321341 A1 Sep. 26, 2024

(30) Foreign Application Priority Data

Mar. 22, 2023 (JP) ................................. 2023-045850

(51) Int. Cl.
*G11C 7/00* (2006.01)
*G11C 11/4074* (2006.01)
(Continued)

(52) U.S. Cl.
CPC ...... *G11C 11/4096* (2013.01); *G11C 11/4074* (2013.01); *G11C 11/4091* (2013.01)

(58) Field of Classification Search
CPC ............ G11C 11/4096; G11C 11/4074; G11C 11/4091

(Continued)

(56) References Cited

U.S. PATENT DOCUMENTS 4,506,341 A * 3/1985 Kalter ................ H03K 19/1772
326/54
6,353,573 B1 * 3/2002 Koshikawa .............. G11C 7/22
365/194

(Continued)

FOREIGN PATENT DOCUMENTS

JP 2008077779 A 4/2008
JP 2011222084 A 11/2011
(Continued)

OTHER PUBLICATIONS

Notice of Reasons for Refusal (Office Action) dated May 19, 2026 mailed in Japanese Patent Application No. 2023-045850, with English machine translation, 13 pages.

*Primary Examiner* — Viet Q Nguyen
(74) *Attorney, Agent, or Firm* — Kim & Stewart LLP

(57) ABSTRACT

A storage device includes a memory cell array, an input/output circuit, and a logic circuit. The input/output circuit including an input/output signal line through which data to be written into the memory cell array is received and data read from the memory cell array is transmitted. The logic circuit is configured to output a first signal to the input/output circuit. The first signal at an active level enables at least a part of the input/output circuit. The logic circuit includes a latch circuit configured to output a second signal at a level corresponding to a value of latched data. The logic circuit receives third, fourth, and fifth signals from an outside of the storage device via the input/output circuit. The logic circuit outputs a negative logical product of the third signal and a logical sum of at least the second, fourth, and fifth signals as the first signal.

20 Claims, 8 Drawing Sheets

(51) Int. Cl.
    *G11C 11/4091*     (2006.01)
    *G11C 11/4096*     (2006.01)

(58) Field of Classification Search
    USPC ................................................... 365/189.011
    See application file for complete search history.

(56)                    References Cited

U.S. PATENT DOCUMENTS

| | | | | |
|---|---|---|---|---|
| 6,504,789 | B2 * | 1/2003 | Hirakawa | G11C 7/22 |
| | | | | 365/194 |
| 9,773,539 | B2 * | 9/2017 | Nakatsuka | H03K 19/18 |
| 10,629,268 | B2 * | 4/2020 | Kato | G11C 16/24 |
| 10,679,706 | B2 * | 6/2020 | Imamoto | G11C 5/025 |
| 10,860,250 | B2 | 12/2020 | Sugahara et al. | |
| 11,158,385 | B2 * | 10/2021 | Kato | G11C 16/08 |
| 11,449,575 | B2 * | 9/2022 | Takeuchi | G06F 17/11 |
| 11,967,385 | B2 * | 4/2024 | Suzuki | G11C 5/145 |
| 12,298,826 | B2 * | 5/2025 | Sugahara | G11C 7/1096 |
| 2006/0126404 | A1 | 6/2006 | Sohn et al. | |
| 2007/0081408 | A1 | 4/2007 | Kwon et al. | |
| 2008/0074930 | A1 | 3/2008 | Kanda | |
| 2011/0249512 | A1 | 10/2011 | Mochizuki et al. | |
| 2018/0018094 | A1 | 1/2018 | Ha et al. | |
| 2021/0295886 | A1 | 9/2021 | Utsumi | |
| 2024/0321326 | A1 * | 9/2024 | Tabata | G11C 7/1087 |
| 2025/0238062 | A1 * | 7/2025 | Sugahara | G06F 1/28 |

FOREIGN PATENT DOCUMENTS

| | | | |
|---|---|---|---|
| JP | 2014044792 | A | 3/2014 |
| JP | 2021149999 | A | 9/2021 |

* cited by examiner

FIG. 1

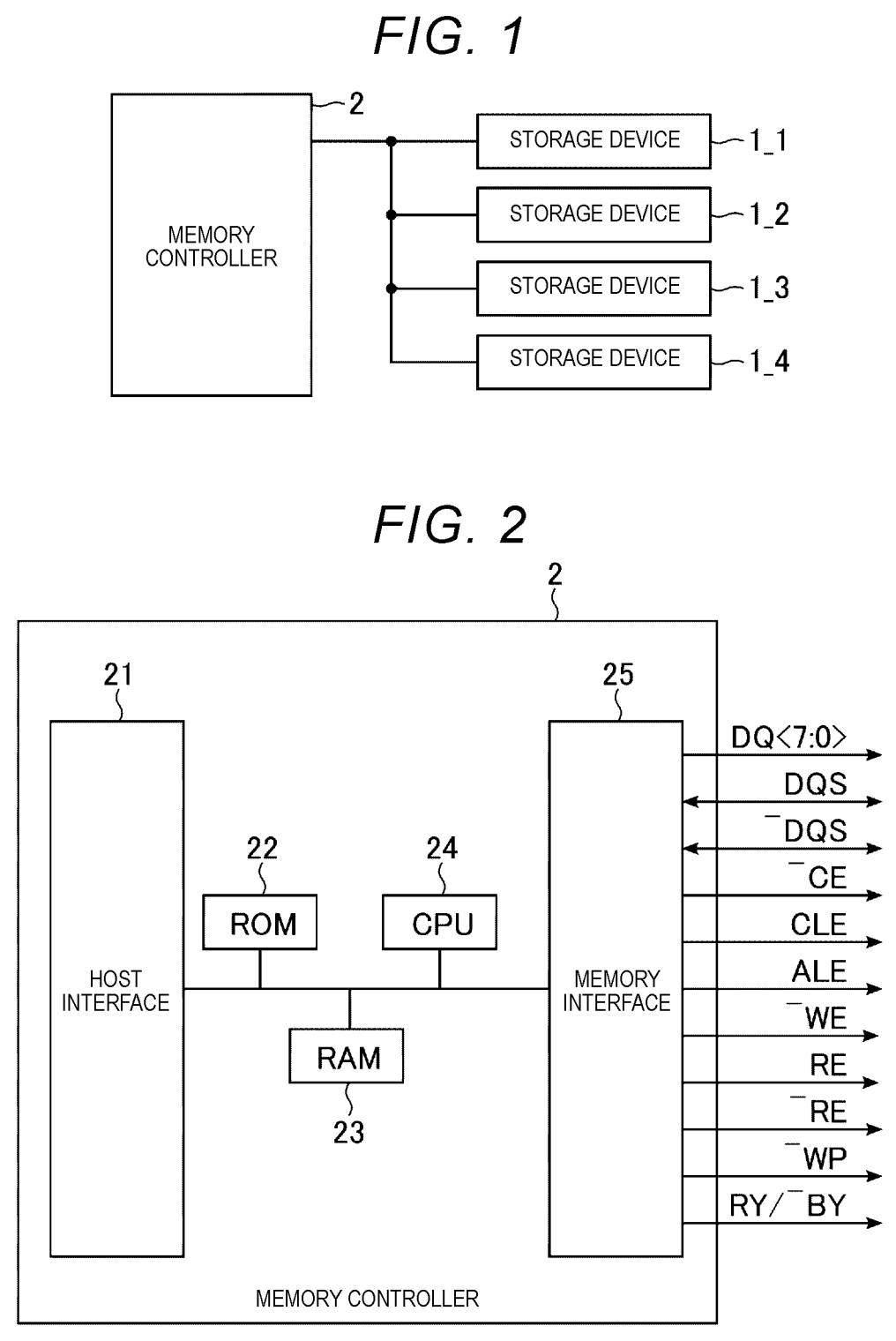

MEMORY CONTROLLER — 2

STORAGE DEVICE — 1_1
STORAGE DEVICE — 1_2
STORAGE DEVICE — 1_3
STORAGE DEVICE — 1_4

FIG. 2

21 — HOST INTERFACE

22 — ROM
24 — CPU
23 — RAM

25 — MEMORY INTERFACE

DQ<7:0>
DQS
$\overline{\text{DQS}}$
$\overline{\text{CE}}$
CLE
ALE
$\overline{\text{WE}}$
RE
$\overline{\text{RE}}$
$\overline{\text{WP}}$
RY/$\overline{\text{BY}}$

MEMORY CONTROLLER

Figure 4:
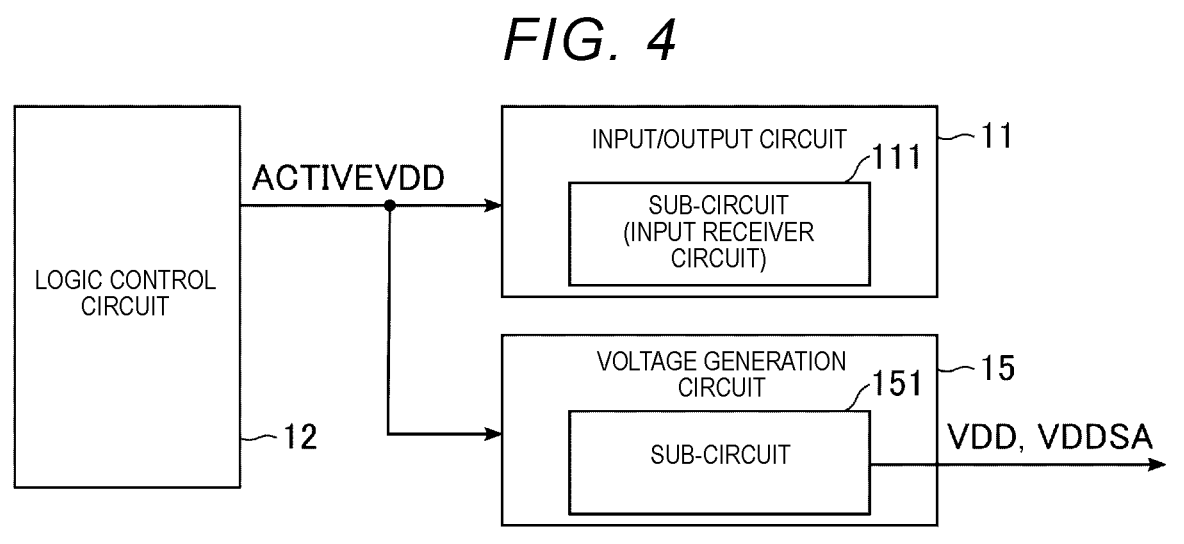

LOGIC CONTROL CIRCUIT ~12

ACTIVEVDD

INPUT/OUTPUT CIRCUIT ~11

SUB-CIRCUIT (INPUT RECEIVER CIRCUIT) ~111

VOLTAGE GENERATION CIRCUIT ~15

SUB-CIRCUIT ~151

VDD, VDDSA

*FIG. 5*

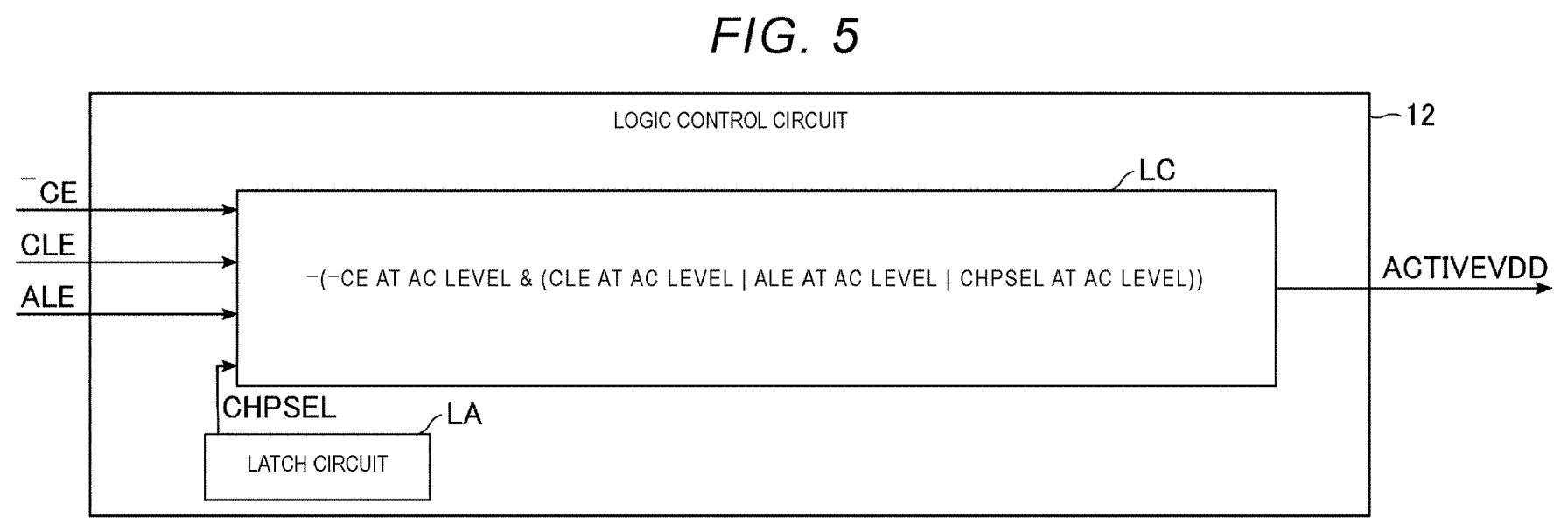

LOGIC CONTROL CIRCUIT

12

ACTIVEVDD

LC

~(~CE AT AC LEVEL & (CLE AT AC LEVEL | ALE AT AC LEVEL | CHPSEL AT AC LEVEL))

CHPSEL

LA

LATCH CIRCUIT

CE

CLE

ALE

*FIG. 6*
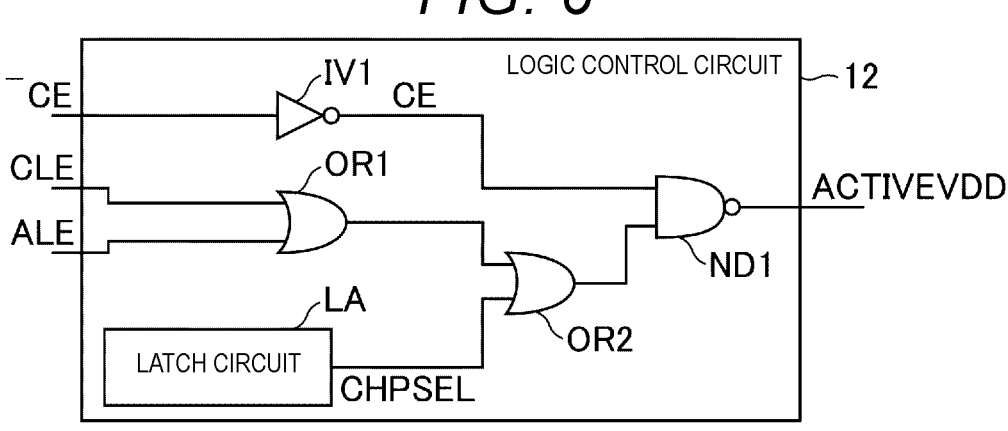
*FIG. 7*
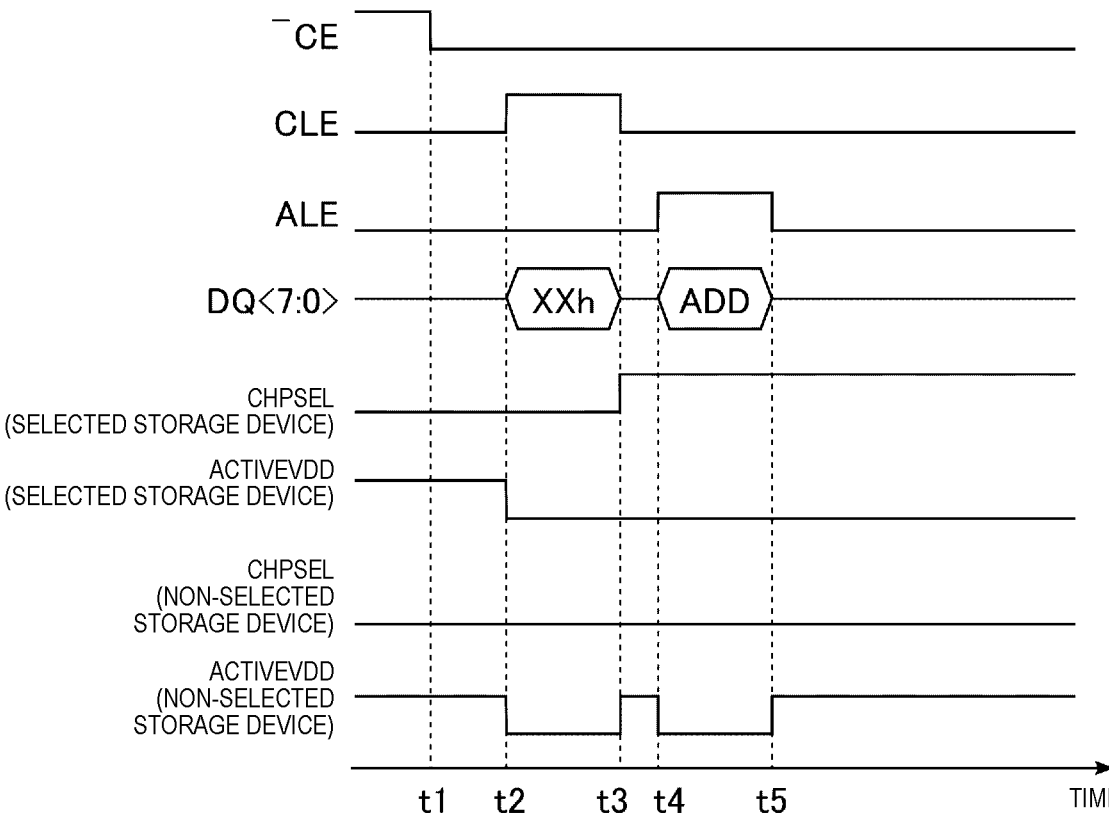

*FIG. 8*

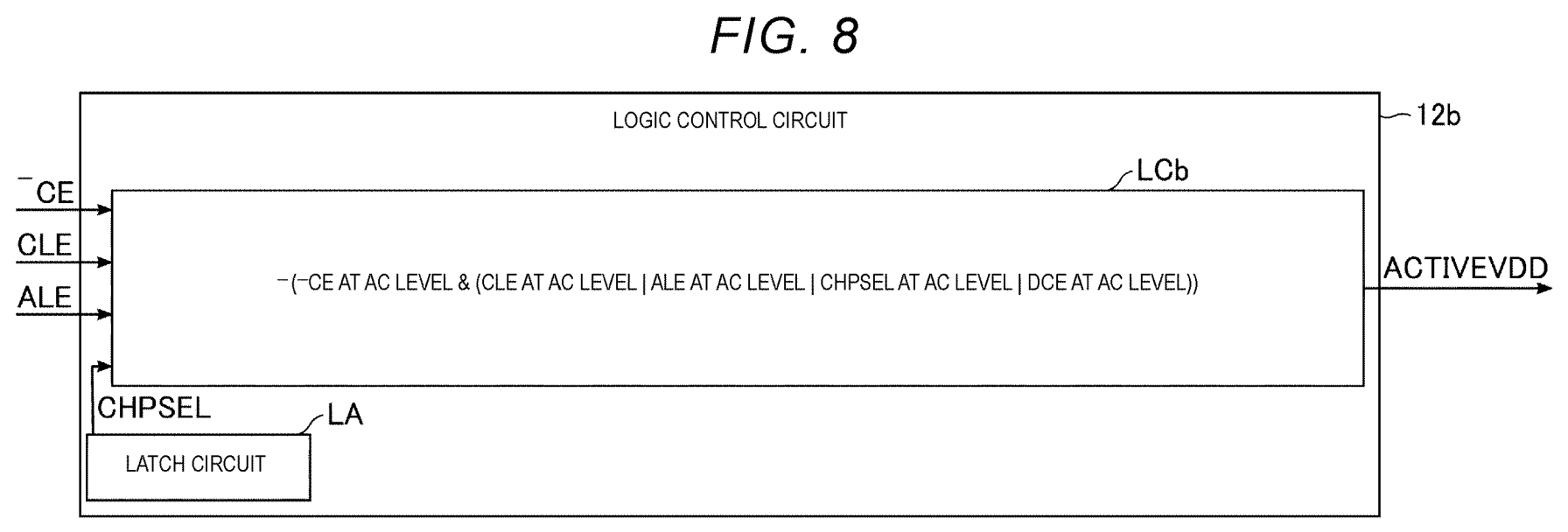

LOGIC CONTROL CIRCUIT

12b

LCb

~(~CE AT AC LEVEL & (CLE AT AC LEVEL | ALE AT AC LEVEL | CHPSEL AT AC LEVEL | DCE AT AC LEVEL))

ACTIVEVDD

LA

CHPSEL

LATCH CIRCUIT

~CE

CLE

ALE

STORAGE DEVICE

CROSS-REFERENCE TO RELATED APPLICATION (S)

This application is based upon and claims the benefit of priority from Japanese Patent Application No. 2023-045850, filed Mar. 22, 2023, the entire contents of which are incorporated herein by reference.

FIELD

Embodiments described herein relate generally to a storage device.

BACKGROUND

A storage device using a semiconductor is known. It is desirable that the storage device consumes only a small amount of current.

BRIEF DESCRIPTION OF THE DRAWINGS

FIG. 1 shows an example of a memory system including a storage device of a first embodiment.

FIG. 2 shows an example of elements and connections of a memory controller connected to the storage device according to the first embodiment.

FIG. 3 shows an example of elements and connections of the storage device according to the first embodiment.

FIG. 4 shows an example of some elements and communicated signals of the storage device according to the first embodiment.

FIG. 5 shows an example of elements of a logic control circuit of the storage device according to the first embodiment and a logical operation performed by the logic control circuit.

FIG. 6 shows an example of the elements and the connections of the elements of the logic control circuit of the storage device according to the first embodiment.

FIG. 7 is a timing chart of some signals during a certain operation of the storage device according to the first embodiment.

FIG. 8 shows an example of elements of a logic control circuit of the storage device according to the second embodiment and a logical operation performed by the logic control circuit.

DETAILED DESCRIPTION

Figure 9:
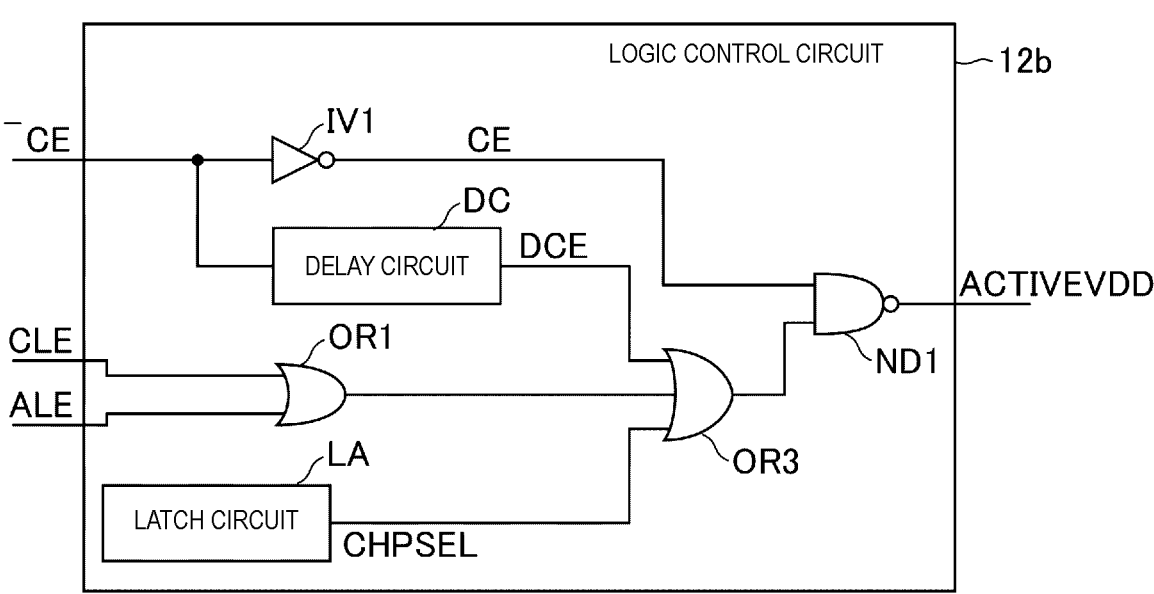
FIG. 9 shows an example of the elements and the connections of the elements of the logic control circuit of the storage device according to the second embodiment.

Embodiments provide a storage device with low power consumption.

In general, according to an embodiment, a storage device includes a memory cell array, an input/output circuit, and a logic circuit. The input/output circuit includes an input/output signal line through which data to be written into the memory cell array is received and data read from the memory cell array is transmitted. The logic circuit is configured to output a first signal to the input/output circuit. The first signal at an active level enables at least a part of the input/output circuit. The logic circuit includes a latch circuit configured to output a second signal at a level corresponding to a value of latched data. The value of the latched data when the storage device is selected in accordance with a signal received via the input/output signal line corresponds to an active level of the second signal. The logic circuit receives a third signal, a fourth signal, and a fifth signal from an outside of the storage device via the input/output circuit. The logic circuit outputs a negative logical product of the third signal and a logical sum of at least the second signal, the fourth signal, and the fifth signal as the first signal.

Embodiments are described below with reference to the drawings. Additional numbers or letters may be designated to the ends of the reference numerals to distinguish from each other a plurality of elements having substantially the same function and configuration in a certain embodiment or different embodiments. In an embodiment subsequent to a certain described embodiment, points different from the described embodiment are mainly described. Descriptions of certain embodiments are applicable as descriptions of other embodiments unless explicitly or obviously excluded.

Each functional block may be realized as hardware, computer software, or a combination of both. Some functions may be executed by a functional block different from the exemplary functional block. Furthermore, the exemplary functional block may be subdivided into finer functional subblocks.

In the present specification and the claims, the expression that a certain first element is "connected to" another second element includes that the first element is connected to the second element through an element that is directly, constantly, or selectively conductive.

1. First Embodiment 1.1. Configuration (Structure)

FIG. 1 shows an example of a memory system including a storage device of a first embodiment. The memory system is controlled by a host device and stores data based on control by the host device. As illustrated in FIG. 1, the memory system includes a plurality of storage devices 1. FIG. 1 shows an example of four storage devices 1 (1_1, 1_2, 1_3, and 1_4). The storage device 1 is connected to the memory controller 2. The plurality of storage devices 1 are connected to the memory controller 2 via a common wiring.

FIG. 2 shows an example of elements and connections of a memory controller 2 connected to the storage device 1 according to the first embodiment.

The memory controller 2 includes a host interface 21, a read only memory (ROM) 22, a random access memory (RAM) 23, a central processing unit (CPU) 24, and a memory interface 25.

The host interface 21 is an interface for the memory controller 2 to communicate with the host device. The host interface 21 may be configured with hardware or a combination of hardware and software.

The ROM 22 is a nonvolatile memory. The ROM 22 stores a program including firmware.

The RAM 23 is a volatile memory. The RAM 23 temporarily stores data and stores the program stored in the ROM 22 while the memory controller 2 receives the supply of power.

The CPU 24 is a circuit that controls the operation of the entire memory controller 2. The memory controller 2 executes various operations by the program stored in the ROM 22 and loaded on the RAM 23 being executed by the CPU 24.

The memory interface 25 is an interface for the memory controller 2 to communicate with the storage device 1. The memory interface 25 may be configured with hardware or a combination of hardware and software. The memory interface 25 is connected to the storage device 1 via a wiring for enabling communication based on the type of the storage device 1. The set of wirings based on the memory interface 25 transmits a plurality of control signals and input/output signals DQ. The control signal includes signals ¯CE, CLE, ALE, ¯WE, RE, ¯RE, ¯WP, DQS, ¯DQS, and ready/busy signals RY/¯BY. A reference numeral "¯" indicates a logic inversion of a signal having a name without the reference numeral "¯".

The input/output signal DQ has an 8-bit width in an example, and includes a command (CMD), write data or read data (DAT), address information (ADD), and a status (STA). The notation of the input/output signal DQ<7:0> indicates that the input/output signal DQ has a width of 8 bits.

The signals DQS and ¯DQS specify the timing of intake of the input/output signal DQ. The digital signal ¯CE enables or disables the storage device 1. The storage device 1 is enabled while receiving a signal ¯CE at a certain level, and is in an operable state. Hereinafter, the level of the signal ¯CE that enables the storage device 1 may be referred to as an active level. The signal ¯CE at the active level has a low level in an example. That is, the signal ¯CE is an active low in an example. In an example, the low level has a potential VSS equal to the magnitude of the ground voltage VSS.

The signal CLE notifies the storage device 1 of the transmission of the command via the input/output signal DQ. The storage device 1 treats the input/output signal DQ received while receiving the signal CLE at a certain level as the command CMD. That is, the storage device 1 enables an intake of the command CMD while receiving the signal CLE at a certain level. Hereinafter, the level of the signal CLE that enables the intake of the command CMD may be referred to as an active level. The signal CLE at the active level has a high level in an example. That is, the signal CLE is an active high in an example. In an example, the high level has a potential equal to the magnitude of the internal power supply voltage VDD.

The signal ALE notifies the storage device 1 of the transmission of the address information via the input/output signal DQ. The storage device 1 treats the input/output signal DQ received while receiving the signal ALE at a certain level as the address information ADD. That is, the storage device 1 enables an intake of the address information ADD while receiving the signal ALE at a certain level. Hereinafter, the level of the signal ALE that enables the intake of the address information ADD may be referred to as an active level. The signal ALE at the active level has a high level in an example. That is, the signal ALE is an active high in an example.

The signal ¯WE instructs the storage device 1 for an intake of the input/output signal DQ. The signals RE and ¯RE instruct the storage device 1 to output the input/output signal DQ. The signal ¯WP instructs the storage device 1 to prohibit writing and erasing of data. The ready/busy signal RY/BY indicates whether the storage device 1 is in a ready state or a busy state, and in an example, indicates the busy state at a low level. The storage device 1 receives a command in the ready state, and does not receive a command in the busy state.

Figure 3:
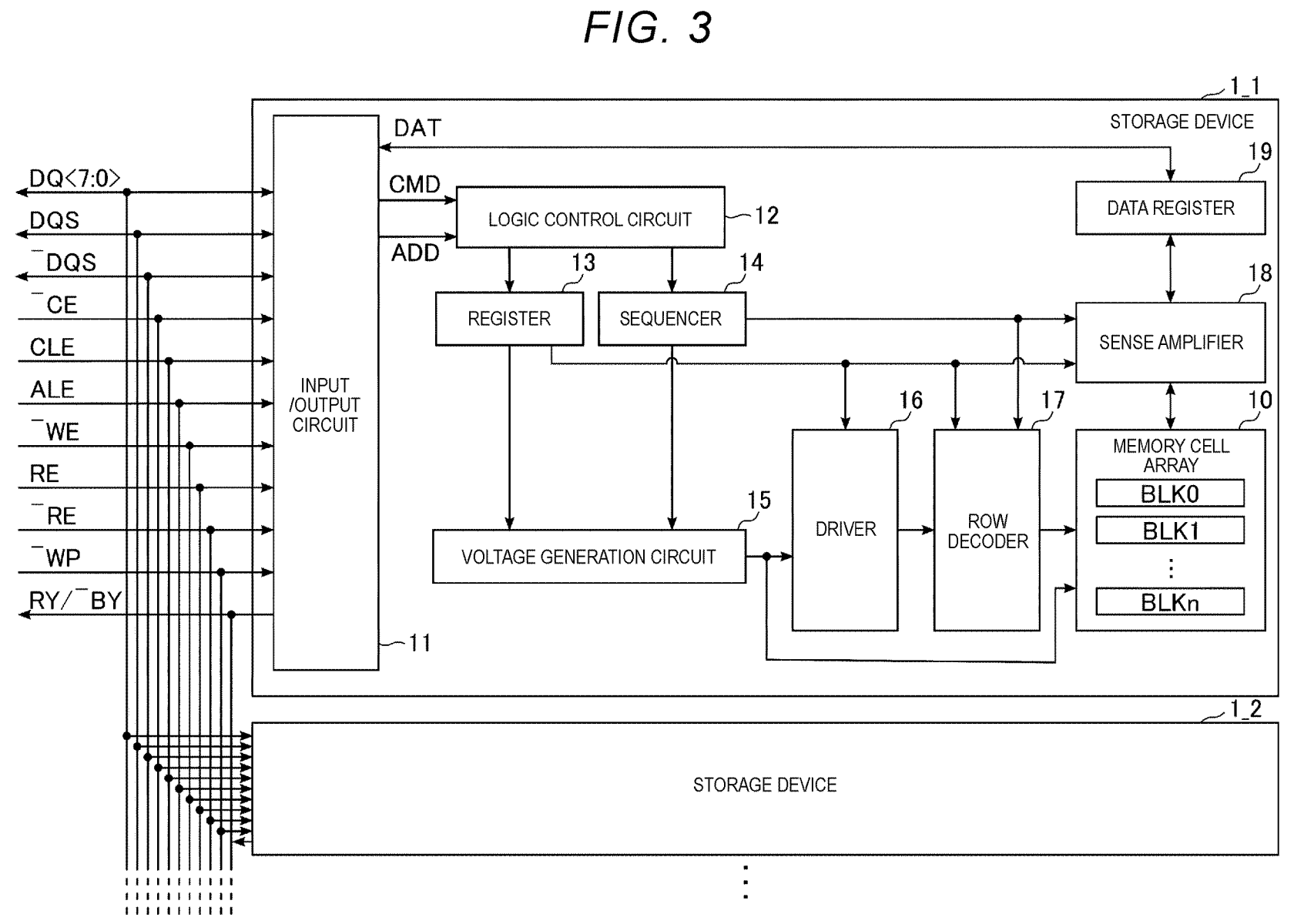

FIG. 3 shows an example of elements and connections of the storage device according to the first embodiment. The storage device 1 includes elements such as a memory cell array 10, an input/output circuit 11, a logic control circuit 12, a register 13, a sequencer 14, a voltage generation circuit 15, a driver 16, a row decoder 17, a sense amplifier 18, and a data register (data cache) 19.

The memory cell array 10 is a set of arranged memory cells. The memory cell array 10 includes a plurality of memory blocks (blocks) BLK (BLK0, BLK1, . . . ). Each block BLK includes a plurality of memory cell transistors MT (not shown). Wirings such as a word line (not shown) and a bit line (not shown) are also located in the memory cell array 10.

The input/output circuit 11 is a circuit that inputs a signal to the storage device 1 and outputs a signal from the storage device 1. The input/output circuit 11 is connected to the memory controller 2 via a wiring. The input/output circuit 11 receives the input/output signal DQ and outputs the input/output signal DQ. The input/output signal DQ transmits the command CMD, the data DAT, and the address information ADD. The command CMD specifies an instruction for various operations including data reading, data writing, and data erasing. The address information ADD includes a block address, a page address, and a column address in an example. Each of the block address, the page address, and the column address specifies the block BLK, the word line WL, and the bit line BL. The input/output circuit 11 receives the signals ¯DQS, ¯DQS, ¯CE, CLE, ALE, ¯WE, RE, ¯RE, and ¯WP, and outputs the signals DQS, ¯DQS, and ready/busy signal RY/¯BY.

The logic control circuit 12 is a circuit that generates a signal for controlling an element in the storage device 1 based on the signal received by the storage device 1. The logic control circuit 12 receives the command CMD and the address information ADD from the input/output circuit 11. The logic control circuit 12 transmits the command CMD and the address information ADD to the register 13. The logic control circuit 12 generates a control signal based on the command CMD and the address information ADD, and supplies the control signal to the sequencer 14. The control signal is a signal used by the sequencer 14 to perform control based on the command CMD and the address information ADD with respect to the elements of the storage device 1.

The register 13 is a circuit that stores the command CMD and the address information ADD received by the storage device 1.

The sequencer 14 is a circuit that controls the operation of the storage device 1 as a whole. The sequencer 14 controls the voltage generation circuit 15, the row decoder 17, and the sense amplifier 18 based on the control signal received from the logic control circuit 12 to execute various operations including data reading, data writing, and data erasing.

The voltage generation circuit 15 is a circuit that generates a plurality of voltages (e.g., operation voltages) having different magnitudes. The voltage generation circuit 15 receives a power supply voltage from the outside of the storage device 1 and generates a plurality of voltages (e.g., operation voltages) from the power supply voltage. The generated voltage is supplied to the elements such as the memory cell array 10 and the driver 16. The voltage generation circuit 15 operates based on the command CMD and the address information ADD stored in the register.

The driver 16 is a circuit that supplies various voltages required for the operation of the storage device 1 to several elements. The driver 16 receives a plurality of voltages from the voltage generation circuit 15 and supplies a selected one of the plurality of voltages to the row decoder 17.

The row decoder 17 is a circuit for selecting the block BLK. The row decoder 17 transfers the voltage supplied from the driver 16 to one selected block BLK based on the block address received from the register 13.

The sense amplifier 18 is a circuit that determines the data stored in the memory cell array 10. The sense amplifier 18 senses the state of the memory cell transistor MT, and generates read data based on the sensed state or transfers write data to the memory cell transistor MT.

The data register 19 is a circuit that stores data for input and output of data via the storage device 1. The data register 19 receives the data DAT received by the storage device 1 and supplies the data based on the received data DAT to the sense amplifier 18. The data register 19 receives the data from the sense amplifier 18 and supplies the data DAT based on the received data to the input/output circuit 11.

A set of wirings that transmit the input/output signals DQ, the signals DQS and ⁻DQS, the signals ⁻CE, CLE, ALE, ⁻WE, RE, ⁻RE, and ⁻WP, and the ready/busy signals RY/BY is connected to the plurality of storage devices 1 (1_1, 1_2, 1_3, and 1_4). FIG. 3 shows only the storage devices 1_1 and 1_2.

FIG. 4 shows an example of some elements and communicated signals of the storage device according to the first embodiment. As illustrated in FIG. 4, the logic control circuit 12 outputs a digital signal ACTIVEVDD. The signal ACTIVEVDD is received by the input/output circuit 11 and the voltage generation circuit 15. The input/output circuit 11 enables one or a plurality of the sub-circuits 111 in the input/output circuit 11 while receiving the signal ACTIVEVDD at a certain level. The voltage generation circuit 15 enables one or a plurality of the sub-circuits 151 in the voltage generation circuit 15 while receiving the signal ACTIVEVDD at a certain level. In an example, the signal ACTIVEVDD that enables the sub-circuits 111 and 151 has a low level. That is, the signal ACTIVEVDD is an active low.

The sub-circuit 111 is a circuit required for the operation of the storage device 1, for example, data reading and data writing. The sub-circuit 111 is in a state in which the input/output signal DQ<7:0> can be received while the sub-circuit 111 is enabled, and specifically, in an example, the internal power supply voltage VDD is supplied to the logic circuit of the sub-circuit 111. An example of the sub-circuit 111 includes an input receiver circuit.

The sub-circuit 151 is a circuit required for the operation of the storage device 1, for example, data reading and data writing. The sub-circuit 151 is in a state of generating and outputting one or a plurality of voltages from the voltage received from the outside of the storage device 1 while the sub-circuit 151 is enabled. An example of the sub-circuit 151 includes a circuit that generates the internal power supply voltages VDD and VDDSA. In an example, the internal power supply voltage VDDSA is supplied to the sense amplifier 18. In an example, the internal power supply voltage VDD is supplied to an element other than the sense amplifier 18 in the storage device 1, such as the input/output circuit 11.

FIG. 5 shows an example of elements of a logic control circuit of the storage device according to the first embodiment and a logical operation performed by the logic control circuit. As shown in FIG. 5, the logic control circuit 12 includes a latch circuit LA and a logic circuit LC. The latch circuit LA latches data of which level corresponds to a level of the digital signal CHPSEL and continues to output the signal CHPSEL at the level corresponding to that of the latched data. The value in the latch circuit LA, that is, the level of the signal CHPSEL is set by a command received by the storage device 1. The signals CHPSEL of the plurality of storage devices 1 have values independent of each other. In an example, the storage devices 1_1, 1_2, 1_3, and 1_4 store the signals CHPSEL1, CHPSEL2, CHPSEL3, and CHPSEL4 in the latch circuits LA, respectively. The signals CHPSEL1, CHPSEL2, CHPSEL3, and CHPSEL4 at a certain level make the storage devices 1_1, 1_2, 1_3, and 1_4 in a selected state, respectively. Hereinafter, the level of the signal CHPSEL that makes the storage device 1 in the selected state may be referred to as an active level. In an example, the signal CHPSEL at the active level has a high level. That is, the signal CHPSEL is active high.

The logic circuit LC performs a logical operation represented by ⁻(signal ⁻CE at the active level & (signal CLE at the active level|signal ALE at the active level|signal CHPSEL at the active level)), and outputs the result of the logical operation as the signal ACTIVEVDD. In FIG. 5, the "active level" is described as the "AC level". The operator "⁻" in the logical operation represents a negative logic of an element following the operator "⁻". The operator "⁻" represents a logical product of operands on both sides of the operator. The operator "|" represents a logical sum of operands on both sides of the operator. The logic control circuit 12 may have any circuit as long as the above-described logical operation can be performed.

Based on an example in which the signal ⁻CE at the active level is at a low level and the signals CLE, ALE, and CHPSEL at the active level are at high levels, the logic control circuit 12 outputs the result of the logical operation represented by ⁻(CE & (CLE|ALE|CHPSEL)) as the signal ACTIVEVDD.

FIG. 6 shows an example of the elements and the connections of the elements of the logic control circuit of the storage device according to the first embodiment. As illustrated in FIG. 6, in an example, the logic control circuit 12 includes an inverter circuit IV1, OR gates OR1 and OR2, and a NAND gate ND1 in addition to the latch circuit LA as described above with reference to FIG. 5.

The inverter circuit IV1 receives the signal ⁻CE. The OR gate OR1 receives the signals CLE and ALE, and outputs a logical sum of the signals CLE and ALE. The OR gate OR2 receives the output of the OR gate OR1 and the output of the latch circuit LA, that is, the signal CHPSEL, and outputs the logical sum of the output of the OR gate OR1 and the output of the latch circuit LA. The NAND gate ND1 receives the output of the inverter circuit IV1 and the output of the OR gate OR2, and outputs the negative logical product of the output of the inverter circuit IV1 and the output of the OR gate OR2. An output of the NAND gate ND1 functions as a signal ACTIVEVDD.

1.2. Operation

FIG. 7 is a timing chart of some signals during a certain operation of the storage device according to the first embodiment. In the following description, the level of each signal is maintained until the described time when the level of the signal transitions to another level. FIG. 7 shows a storage device (a selected storage device) 1 that is in a selected state in the period shown in FIG. 7 and a storage device (a non-selected storage device) 1 that is not selected (non-selected) in the period shown in FIG. 7.

At the time of the start of the period shown in FIG. 7, each signal has the following level. The signal $^-$CE has a level that is not an active level, that is, an inactive level, and has a high level in an example. The signal CLE has the inactive level and has a low level in an example. The signal ALE has the inactive level and has a low level in an example. The signal CHPSEL in both the selected storage device 1 and the non-selected storage device 1 has an inactive level, for example, a low level.

At time t1, the level of the signal $^-$CE goes into an active level, that is, for example, a low level. At time t1, the signals CLE and ALE have inactive levels, and the signal CHPSEL has an inactive level in both the selected storage device 1 and the non-selected storage device 1. Therefore, even if the level of the signal-CE goes into the active level at time t1, the signal ACTIVEVDD in both the selected storage device 1 and the non-selected storage device 1 maintains the inactive level.

At time t2, the level of the signal CLE goes into the active level. As a result, the level of the signal ACTIVEVDD of the selected storage device 1 goes into an active level and goes into a low level in an example. As a result, in the selected storage device 1, the sub-circuits 111 and 151 are enabled. Therefore, the selected storage device 1 generates the internal power supply voltages VDD and VDDSA, and is in a state of being able to receive the input/output signal DQ.

Based on the fact that the level of the signal CLE goes into the active level at time t2, the level of the signal ACTIVEVDD of the non-selected storage device 1 also goes into the active level. As a result, in the non-selected storage device 1, the sub-circuits 111 and 151 are enabled. Therefore, the non-selected storage device 1 generates the internal power supply voltages VDD and VDDSA, and is in a state of being able to receive the input/output signal DQ.

In addition, the command XXh is transmitted as the input/output signal DQ from the time t2. The command XXh is a command for selecting one storage device 1. The selected storage device 1 and the non-selected storage device 1 generate the internal power supply voltage VDD at time t2, and are in a state of being able to receive the input/output signal DQ. Therefore, the selected storage device 1 and the non-selected storage device 1 receive the command XXh from the time t2 via the signal CLE at the active level.

At time t3, one storage device 1 is selected by receiving the command XXh. In the selected storage device 1, information indicating the selection is supplied to the latch circuit LA, and the value indicating the selection, that is, the value of the signal CHPSEL at the active level is stored in the latch circuit LA. As a result, from time t3, the level of the signal CHPSEL of the selected storage device 1 goes into an active level, in an example, a high level. Therefore, at time t3, the signal ACTIVEVDD of the selected storage device 1 maintains the active level. After the time t3, the signal CHPSEL of the selected storage device 1 maintains the active level. Therefore, after time t3, the signal ACTIVEVDD of the selected storage device 1 maintains the active level.

At time t3, the level of the signal CLE goes into the inactive level. Therefore, at time t3, the level of the signal ACTIVEVDD of the non-selected storage device 1 goes into the inactive level.

At time t4, the level of the signal ALE goes into the active level. In addition, the address information ADD is transmitted as the input/output signal DQ from the time t4. In the selected storage device 1, at time t4, the signal ACTIVEVDD has the active level. Therefore, the selected storage device 1 performs intake of the address information ADD from the time t4.

Based on the fact that the level of the signal ALE goes into the active level at time t4, at time t4, the level of the signal ACTIVEVDD of the non-selected storage device 1 goes into the active level. Therefore, the non-selected storage device 1 performs intake of the address information ADD from the time t4.

At time t5, the level of the signal ALE goes into the inactive level. Therefore, at time t5, the level of the signal ACTIVEVDD of the non-selected storage device 1 goes into the inactive level.

1.3. Advantages

According to the first embodiment, as described below, a storage device 1 having a small consumption current is provided.

It is considered that the signal ACTIVEVDD has the same level as the level of the signal $^-$CE. In this case, in both the selected storage device and the non-selected storage device, the sub-circuits that receive the signal ACTIVEVDD of the input/output circuit and the voltage generation circuit remain enabled while the signal $^-$CE is active. Therefore, in both the selected storage device and the non-selected storage device, the sub-circuits of the input/output circuit and the sub-circuits of the voltage generation circuit thereof remain enabled after the level of the signal $^-$CE goes into the active level.

In the selected storage device, it is necessary to generate a voltage via the voltage generation circuit for the operation after the level of the signal $^-$CE goes into the active level. Therefore, it is necessary for the signal ACTIVEVDD to continue to be at the active level for the operation of the selected storage device. Meanwhile, in the non-selected storage device, it is not necessary that the input/output circuit and the voltage generation circuit are in an operable state except during the reception of the command CMD and the address information ADD. Therefore, even when the signal $^-$CE is at the active level, the input/output circuit and the voltage generation circuit are in operable state except during the reception of the command CMD and the address information ADD, which leads to the consumption of unnecessary current.

According to the first embodiment, the storage device 1 maintains the signal ACTIVEVDD at the active level when the storage device 1 is selected while the signal $^-$CE is at the active level, and maintains the signal ACTIVEVDD at the active level while the signal CLE or ALE is at the active level when the storage device 1 is not selected. When the storage device 1 is not selected, the storage device 1 maintains the signal ACTIVEVDD at the inactive level while the signal CLE or ALE is at the inactive level even if the signal $^-$CE is at the active level.

Depending on the level of such a signal, when the storage device 1 is not selected, the storage device 1 maintains the sub-circuit 111 of the input/output circuit 11 and the sub-circuit 151 of the voltage generation circuit 15 in an enabled state while the signals CLE and ALE are at the active level even if the signal $^-$CE is at the active level. Therefore, the storage device 1 can receive the command CMD and the address information ADD even if the storage device 1 is not selected. When the storage device 1 is not selected, the storage device 1 maintains the sub-circuit 111 of the input/output circuit 11 and the sub-circuit 151 of the voltage generation circuit 15 in a disabled state while the signals CLE and ALE are at the inactive level even if the signal $^-$CE is at the active level. Therefore, the power consumption while the storage device 1 is not selected is reduced.

Meanwhile, when the storage device 1 is selected, the storage device 1 maintains the sub-circuit 111 of the input/output circuit 11 and the sub-circuit 151 of the voltage generation circuit 15 in an enabled state while the signal ⁻CE is active. Therefore, even if the configuration for reducing the current consumption via the non-selected storage device 1 is provided, the storage device 1 can operate in the same manner as in a case where the configuration for reducing the current consumption via the non-selected storage device 1 is not provided when the storage device 1 is selected.

2. Second Embodiment

FIG. 8 shows an example of elements of a logic control circuit of the storage device according to the second embodiment and a logical operation performed by the logic control circuit. As illustrated in FIG. 8, the logic control circuit 12b of the storage device 1b according to the second embodiment includes a logic circuit LCb instead of the logic circuit LC in the first embodiment.

The logic circuit LCb performs a logical operation represented by ⁻(signal ⁻CE at the active level & (signal CLE at the active level|signal ALE at the active level|signal CHPSEL at the active level|signal DCE at the active level)), and outputs the result of the logical operation as the signal ACTIVEVDD. The signal DCE is a delay signal of the signal ⁻CE, that is, has a logic level that follows a change in the logic level of the signal ⁻CE after a certain delay time DT has elapsed from the change in the logic level of the signal ⁻CE.

Based on an example in which the signal ⁻CE at the active level is at a low level and the signals CLE, ALE, and CHPSEL at the active level are at high levels, the logic control circuit 12 outputs the result of the logical operation represented by ⁻(CE & (CLE|ALE|CHPSEL|DCE)) as the signal ACTIVEVDD.

FIG. 9 shows an example of the elements and the connections of the elements of the logic control circuit of the storage device according to the second embodiment. As illustrated in FIG. 9, the logic control circuit 12b according to the second embodiment includes an OR gate OR3 instead of the OR gate OR2 provided in the logic control circuit 12 according to the first embodiment, and further includes a delay circuit DC.

The delay circuit DC receives the signal ⁻CE and outputs the signal DCE. The signal DCE is a signal obtained by delaying the signal ⁻CE by a constant delay time DT.

The OR gate OR3 is a three-input OR gate. The OR gate OR3 receives the signal DCE, the output of the OR gate OR1, and the signal CHPSEL.

The NAND gate ND1 receives the signal CE and the output of the OR gate OR3.

Figure 10:
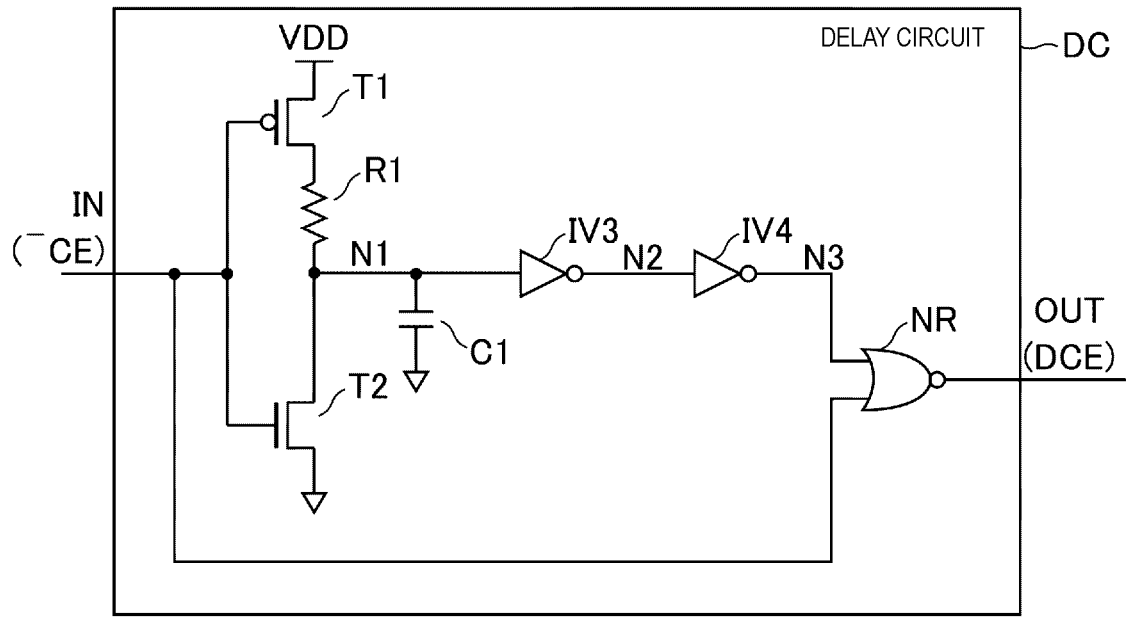
FIG. 10 shows an example of the elements and the connections of the elements of the delay circuit of the storage device according to the second embodiment.

FIG. 10 shows an example of the elements and the connections of the elements of the delay circuit of the storage device according to the second embodiment. As illustrated in FIG. 10, the delay circuit DC includes a p-type metal oxide semiconductor field effect transistor (MOSFET) T1, an n-type MOSFET T2, a capacitor C1, inverter circuits IV3 and IV4, and a NOR gate NR. Hereinafter, one of the source and the drain of the transistor may be referred to as one end, and the other may be referred to as the other end.

One end of the transistor T1 is connected to the node of the internal power supply voltage VDD. The other end of the transistor T1 is connected to one end of the resistor R1. The gate of the transistor T1 receives the input signal IN of the delay circuit DC.

The other end of the resistor R1 is connected to one end of the transistor T2. The node where the other end of the resistor R1 and the transistor T2 are connected transmits the signal N1.

The other end of the transistor T2 is connected to the node of the ground voltage. The gate of the transistor T2 receives the input signal IN.

One end of the capacitor C1 is connected to the other end of the resistor R1. The other end of the capacitor C1 is connected to the node of the ground voltage. The inverter circuit IV3 receives the signal N1 and outputs the signal N2. The inverter circuit IV4 receives the signal N2 and outputs the signal N3.

The NOR gate NR receives the signal N3 and the input signal IN, and outputs a negative logical sum of the signal N3 and the input signal IN. An output of the NOR gate NR functions as an output signal OUT of the delay circuit DC.

Figures 11, 12:
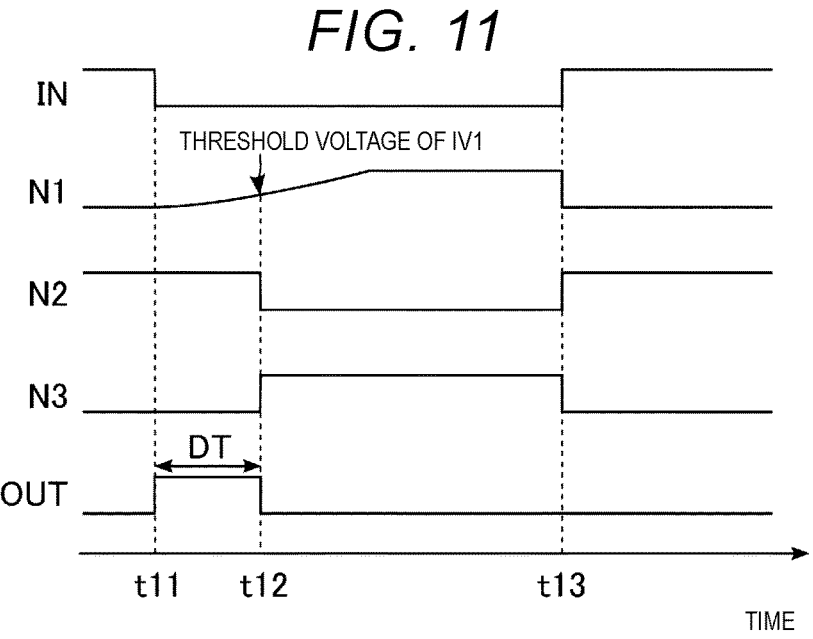
FIG. 11 is a timing chart of some signals in a delay circuit of the storage device according to the second embodiment.
FIG. 12 is a timing chart of some signals during a certain operation of the storage device according to the second embodiment.

FIG. 11 is a timing chart of some signals in a delay circuit of the storage device according to the second embodiment. At the time of the start of the period shown in FIG. 11, the input signal IN, the signal N2, the signal N3, and the output signal OUT have a high level, a high level, a low level, and a low level, respectively. The signal N1 has a potential VSS equal to the magnitude of the ground voltage VSS.

At time t11, the level of the input signal IN goes into a low level. Accordingly, the level of the output signal OUT goes into a high level. In addition, the voltage of the signal N1 starts to rise from time t11 due to the transition of the level of the input signal IN to the low level. The rate of increase of the signal N1 is based on the resistance of the resistor R1 and the capacitance of the capacitor C1.

The voltage of the signal N1 continues to rise, and reaches the threshold voltage of the inverter circuit IV3 shown in FIG. 10 at time t12. Accordingly, at time t12, the level of the signal N2 goes into a low level, and the level of the signal N3 goes into a high level. Based on the level of the signal N3 going into a high level, the level of the output signal OUT goes into a low level at time t12. That is, the output signal OUT maintains a high level from the time t11 when the level of the input signal IN transitions to a low level to the time t12. As described above, the delay circuit DC generates a one-shot pulse from the time t11 to the time t12. The interval between the time t11 and the time t12 is equal to the delay time DT. The delay time DT is equal to the time from when the voltage of the signal N1 starts to rise until the voltage reaches the threshold voltage of the inverter circuit IV3, and the rate of increase in the voltage of the signal N1 is based on the resistance of the resistor R1 and the capacitance of the capacitor C1. Therefore, the delay time DT can be set to a desired length by selecting the resistance of the resistor R1 and the capacitance of the capacitor C1.

At time t13, the level of the input signal IN goes into a high level. Accordingly, the level of the signal N1 goes into a low level, the level of the signal N2 goes into a high level, and the level of the signal N3 goes into a low level. Meanwhile, the level of the output signal OUT does not change even when the level of the input signal IN transitions to a high level.

FIG. 12 is a timing chart of some signals during a certain operation of the storage device according to the second embodiment. Similarly to FIG. 7, FIG. 12 shows a storage device (a selected storage device) 1b that is in a selected state in the period shown in FIG. 12 and a storage device (a non-selected storage device) 1*b* that is not selected (non-selected) in the period shown in FIG. 12.

Each signal at the time of the start of the period shown in FIG. 12 has the same level as that shown in the first embodiment (FIG. 7). In addition, the signal DCE has the inactive level, in an example, a low level.

At time t21, the level of the signal ⁻CE goes into an active level, in an example, a low level. As a result, the level of the signal DCE goes into an active level, in an example, a high level. Therefore, at time t21, the level of the signal ACTIVEVDD goes into a high level in both the selected storage device 1 and the non-selected storage device 1, regardless of the levels of the signals CHPSEL, CLE, and ALE.

The transition of the level of the signal other than the signal ACTIVEVDD at times t22, t23, t24, and t25 is the same as the transition at times t2, t3, t4, and t5 in FIG. 7 according to the first embodiment. Therefore, the selected storage device 1 and the non-selected storage device 1 receive the command XXh from the time t22 based on the signal CLE at the active level. At time t23, one storage device 1 is selected by receiving the command XXh. Accordingly, after time t23, the signal CHPSEL of the selected storage device 1 maintains the active level. Therefore, after time t23, the signal ACTIVEVDD maintains the active level regardless of the levels of the signals DCE, CLE, and ALE.

At time t26, the level of the signal DCE goes into the inactive level. The interval between the time t21 and the time t26 is equal to the delay time DT. Based on the fact that the level of the signal DCE goes into the inactive level, from time t26, the signal ACTIVEVDD maintains the active level while any of the signal CHPSEL, the signal CLE, and the signal ALE is at the active level. In the selected storage device 1*b*, since the signal CHPSEL maintains the active level from the time t23, the signal ACTIVEVDD maintains the active level even if the signal DCE is at the inactive level. Meanwhile, in the non-selected storage device 1*b*, the signal CHPSEL maintains the inactive level from the time t21. Therefore, after time t26, the signal ACTIVEVDD of the non-selected storage device 1*b* maintains the active level only while the signals CLE and ALE are at the active level. That is, after the delay time DT has elapsed from the transition of the level of the signal ⁻CE to the active level, the storage device 1*b* performs the same operation as the storage device 1 according to the first embodiment.

The details of the transition of the levels of the signals ⁻CE, CLE, ALE, CHPSEL, and ACTIVEVDD at the times t27, t28, t29, and t30 and the input/output signals DQ are the same as the transitions at the times t2, t3, t4, and t5 in FIG. 7 according to the first embodiment.

According to the second embodiment, the storage device 1*b* maintains the signal ACTIVEVDD at the active level from the transition to the active level to the delay time DT in a case where the level of the signal ⁻CE goes into the active level, regardless of whether or not the storage device 1*b* is selected. Therefore, the storage device 1*b* immediately enables the sub-circuit 111 of the input/output circuit 11 and the sub-circuit 151 of the voltage generation circuit 15 with the transition of the level of the signal ⁻CE to the active level, regardless of whether or not the storage device 1*b* is selected. Therefore, the storage device 1*b* can operate immediately after the transition of the level of the signal ⁻CE to the active level, and thus, the command CMD and the address information ADD can be received.

Meanwhile, after the delay time DT has elapsed, as in the first embodiment, the storage device 1*b* maintains the signal ACTIVEVDD at the active level when the storage device 1*b* is selected, and maintains the signal ACTIVEVDD at the active level while the signal CLE or ALE is at the active level when the storage device 1*b* is not selected. Therefore, after the delay time DT has elapsed, the same advantages as those of the first embodiment can be obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:
a memory cell array;
an input/output circuit including an input/output signal line through which data to be written into the memory cell array is received and data read from the memory cell array is transmitted; and
a logic circuit configured to output a first signal to the input/output circuit, the first signal at an active level enabling at least a part of the input/output circuit, wherein
the logic circuit includes a latch circuit configured to output a second signal at a level corresponding to a value of latched data, wherein the value of the latched data when the storage device is selected in accordance with a signal received via the input/output signal line corresponds to an active level of the second signal,
the logic circuit receives a third signal, a fourth signal, and a fifth signal from an outside of the storage device via the input/output circuit, and
the logic circuit outputs a negative logical product of the third signal and a logical sum of at least the second signal, the fourth signal, and the fifth signal as the first signal.

2. The storage device according to claim 1, wherein the signal received via the input/output signal line is a command.

3. The storage device according to claim 2, wherein a signal received via the input/output signal line while the fourth signal is at an active level is recognized as the command.

4. The storage device according to claim 3, wherein the third signal at an active level enables operation of the storage device.

5. The storage device according to claim 4, wherein a signal received via the input/output signal line while the fifth signal is at an active level is recognized as address information.

6. The storage device according to claim 1, wherein
when the second signal is at the active level, the first signal is at the active level regardless of levels of the fourth signal and the fifth signal, and
when the second signal is at an non-active level, the first signal is at the active level only if at least one of the fourth signal and the fifth signal is at an active level.

7. The storage device according to claim 1, wherein the part of the input/output circuit enabled by the first signal at the active level includes an input receiver circuit that receives signals via the input/output signal line.

8. The storage device according to claim 1, further comprising:

a voltage generation circuit configured to generate operation voltages supplied to one or more circuits of the storage device, wherein the first signal at the active level enables at least a part of the voltage generation circuit.

9. The storage device according to claim 8, further comprising:

a sense amplifier configured to sense values of data stored in the memory cell array, wherein the part of the voltage generation circuit enabled by the first signal at the active level includes a circuit that supplies an operation voltage to the sense amplifier.

10. The storage device according to claim 1, wherein the logic circuit includes a delay circuit configured to delay the third signal, and the logic circuit outputs a negative logical product of the third signal and a logical sum of at least the second signal, the delayed third signal, the fourth signal, and the fifth signal as the first signal.

11. The storage device according to claim 10, wherein when the second signal is at the active level, the first signal is at the active level regardless of levels of the delayed third signal, the fourth signal, and the fifth signal, and when the second signal is at an non-active level, the first signal is at the active level only if at least one of the delayed third signal, the fourth signal, and the fifth signal is at an active level.

12. A storage device comprising:

a memory cell array;

an input/output circuit including an input/output signal line through which data to be written into the memory cell array is received and data read from the memory cell array is transmitted;

a voltage generation circuit configured to generate operation voltages supplied to one or more circuits of the storage device; and a logic circuit configured to output a first signal to the voltage generation circuit, the first signal at an active level enabling at least a part of the voltage generation circuit, wherein the logic circuit includes a latch circuit configured to output a second signal at a level corresponding to a value of latched data, wherein the value of the latched data when the storage device is selected in accordance with a signal received via the input/output signal line corresponds to an active level of the second signal, the logic circuit receives a third signal, a fourth signal, and a fifth signal from an outside of the storage device via the input/output circuit, and the logic circuit outputs a negative logical product of the third signal and a logical sum of at least the second signal, the fourth signal, and the fifth signal as the first signal.

13. The storage device according to claim 12, wherein the signal received via the input/output signal line is a command.

14. The storage device according to claim 13, wherein a signal received via the input/output signal line while the fourth signal is at an active level is recognized as the command.

15. The storage device according to claim 14, wherein the third signal at an active level enables operation of the storage device.

16. The storage device according to claim 15, wherein a signal received via the input/output signal line while the fifth signal is at an active level is recognized as address information.

17. The storage device according to claim 12, wherein when the second signal is at the active level, the first signal is at the active level regardless of levels of the fourth signal and the fifth signal, and when the second signal is at an non-active level, the first signal is at the active level only if at least one of the fourth signal and the fifth signal is at an active level.

18. The storage device according to claim 12, wherein the part of the voltage generation circuit enabled by the first signal at the active level includes a sense amplifier configured to sense values of data stored in the memory cell array.

19. The storage device according to claim 12, wherein the logic circuit includes a delay circuit configured to delay the third signal, and the logic circuit outputs a negative logical product of the third signal and a logical sum of at least the second signal, the delayed third signal, the fourth signal, and the fifth signal as the first signal.

20. The storage device according to claim 19, wherein when the second signal is at the active level, the first signal is at the active level regardless of levels of the delayed third signal, the fourth signal, and the fifth signal, and when the second signal is at an non-active level, the first signal is at the active level only if at least one of the delayed third signal, the fourth signal, and the fifth signal is at an active level.

\* \* \* \* \*